United States Patent

(12) United States Patent
Tanaka

(10) Patent No.: US 9,787,279 B2
(45) Date of Patent: Oct. 10, 2017

(54) BALUN TRANSFORMER

(71) Applicant: Murata Manufacturing Co., Ltd., Nagaokakyo-shi, Kyoto-fu (JP)

(72) Inventor: Akira Tanaka, Nagaokakyo (JP)

(73) Assignee: Murata Manufactruing Co., Ltd., Kyoto (JP)

( * ) Notice: Subject to any disclaimer, the term of this patent is extended or adjusted under 35 U.S.C. 154(b) by 0 days.

(21) Appl. No.: 15/007,397

(22) Filed: Jan. 27, 2016

(65) Prior Publication Data

US 2016/0142037 A1 May 19, 2016

Related U.S. Application Data

(63) Continuation of application No. PCT/JP2014/054679, filed on Feb. 26, 2014.

(30) Foreign Application Priority Data

Jul. 31, 2013 (JP) .................... 2013-158503
Jan. 27, 2014 (JP) .................... 2014-012221

(51) Int. Cl.
*H03H 7/42* (2006.01)
*H01P 5/10* (2006.01)
*H01F 17/00* (2006.01)
*H01F 27/28* (2006.01)
*H01F 27/29* (2006.01)
(Continued)

(52) U.S. Cl.
CPC ........... *H03H 7/42* (2013.01); *H01F 17/0013* (2013.01); *H01F 27/2804* (2013.01); *H01F 27/29* (2013.01); *H01F 27/40* (2013.01); *H01P 5/10* (2013.01); *H01F 2027/2809* (2013.01); *H03H 2001/0085* (2013.01)

(58) Field of Classification Search
CPC .................................... H03H 7/42; H01P 5/10
USPC ............................................ 333/25, 26, 246
See application file for complete search history.

(56) References Cited

U.S. PATENT DOCUMENTS 6,018,277 A * 1/2000 Vaisanen .................. H01P 5/10
                                                                333/161
6,483,415 B1 * 11/2002 Tang ................... H01F 17/0013
                                                                333/26
(Continued)

FOREIGN PATENT DOCUMENTS

CN    1461488 A    12/2003
CN    1622452 A    6/2005
(Continued)

OTHER PUBLICATIONS

Official Communication issued in International Patent Application No. PCT/JP2014/054679, dated Jun. 10, 2014.

*Primary Examiner* — Dean Takaoka
(74) *Attorney, Agent, or Firm* — Keating & Bennett, LLP

(57) ABSTRACT

A balun transformer includes an input terminal into which an unbalanced signal is input, a converter that includes at least a first signal line connected to the input terminal and that converts the unbalanced signal into a balanced signal, a first output terminal connected to the first signal line, a second output terminal from which the balanced signal is output, the balanced signal being also output from the first output terminal, and a capacitor connected between the input terminal and the second output terminal.

17 Claims, 12 Drawing Sheets

(51) Int. Cl.
*H01F 27/40* (2006.01)
*H03H 1/00* (2006.01)

(56) References Cited

U.S. PATENT DOCUMENTS

| | | | | |
|---|---|---|---|---|
| 6,768,410 | B1* | 7/2004 | Yazaki | H01F 17/0013 333/25 |
| 7,005,956 | B2* | 2/2006 | Wang | H03H 7/42 333/25 |
| 7,183,872 | B2* | 2/2007 | Lee | H01P 5/10 333/25 |
| 7,528,676 | B2* | 5/2009 | Kearns | H01P 5/10 333/185 |
| 7,978,021 | B2* | 7/2011 | Tamaru | H03H 7/42 333/246 |
| 8,547,186 | B2* | 10/2013 | Kirkeby | H01P 5/10 333/125 |
| 8,633,781 | B2* | 1/2014 | Bradley | H03H 7/38 333/187 |
| 2005/0116787 | A1 | 6/2005 | Ohi et al. | |
| 2009/0243777 | A1 | 10/2009 | Toi et al. | |

FOREIGN PATENT DOCUMENTS

| | | |
|---|---|---|
| JP | 2010-040882 A | 2/2010 |
| WO | 2008/105213 A1 | 9/2008 |

\* cited by examiner

BALUN TRANSFORMER

BACKGROUND OF THE INVENTION

1. Field of the Invention

The present invention relates to a balun transformer, and more particularly, to a balun transformer that converts an unbalanced signal into a balanced signal.

2. Description of the Related Art

As an invention concerning a balun transformer of the related art, a multilayer transformer component disclosed in International Publication No. 2008/105213, for example, is known. The multilayer transformer component disclosed in International Publication No. 2008/105213 converts an unbalanced signal into a balanced signal and outputs the balanced signal. In such a multilayer transformer component, it is desirable to improve balance characteristics of a balanced signal.

SUMMARY OF THE INVENTION

Accordingly, preferred embodiments of the present invention provide a balun transformer in which balance characteristics are improved.

A balun transformer according to a preferred embodiment of the present invention includes an input terminal into which an unbalanced signal is input; a converter that includes at least a first signal line connected to the input terminal and that converts the unbalanced signal into a balanced signal; a first output terminal connected to the first signal line; a second output terminal from which the balanced signal is output, the balanced signal being also output from the first output terminal; and a capacitor connected between the input terminal and the second output terminal.

According to various preferred embodiments of the present invention, it is possible to improve balance characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
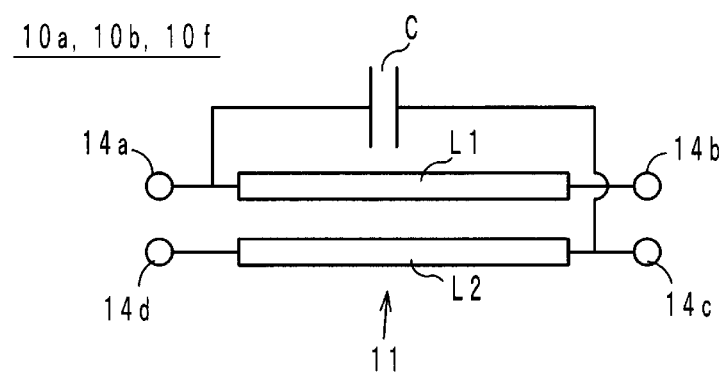
FIG. 1 is a circuit diagram of a balun transformer according to a preferred embodiment of the present invention.

Balun transformers according to preferred embodiments will be described below with reference to the drawings. FIG. 1 is a circuit diagram of a balun transformer $10a$ according to a preferred embodiment of the present invention.

As shown in FIG. 1, the balun transformer $10a$ includes a converter 11, a capacitor C, and outer terminals $14a$ through $14d$. The converter 11 includes signal lines L1 and L2.

The signal line L1 is connected between the outer terminals $14a$ and $14b$. The signal line L2 is connected between the outer terminals $14c$ and $14d$. The signal lines L1 and L2 are electromagnetically coupled with each other. The capacitor C is connected between the outer terminals $14a$ and $14c$.

In the balun transformer $10a$ with the structure described above, the outer terminal $14a$ is an input terminal into which an unbalanced signal is input, the outer terminals $14b$ and $14c$ are output terminals from which a balanced signal is output, and the outer terminal $14d$ is a ground terminal to be grounded.

Figure 2:
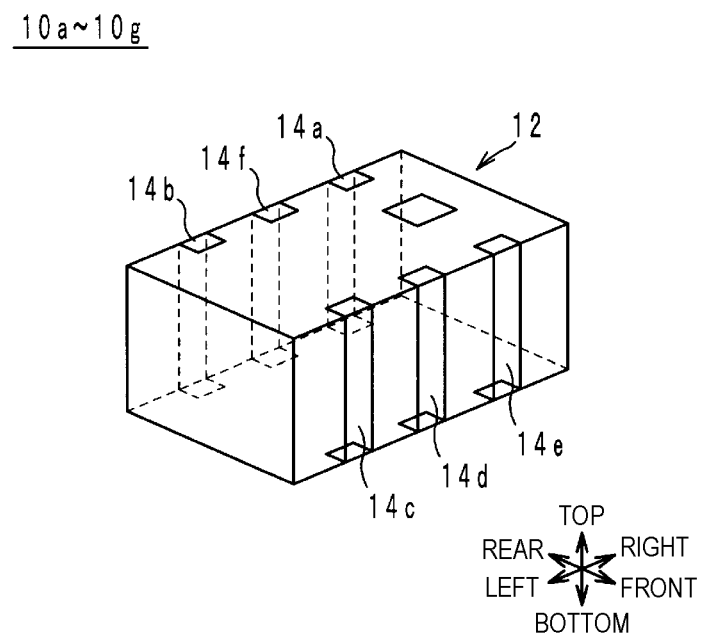
FIG. 2 is an external perspective view of a balun transformer according to a first preferred embodiment of the present invention.
Figure 3:
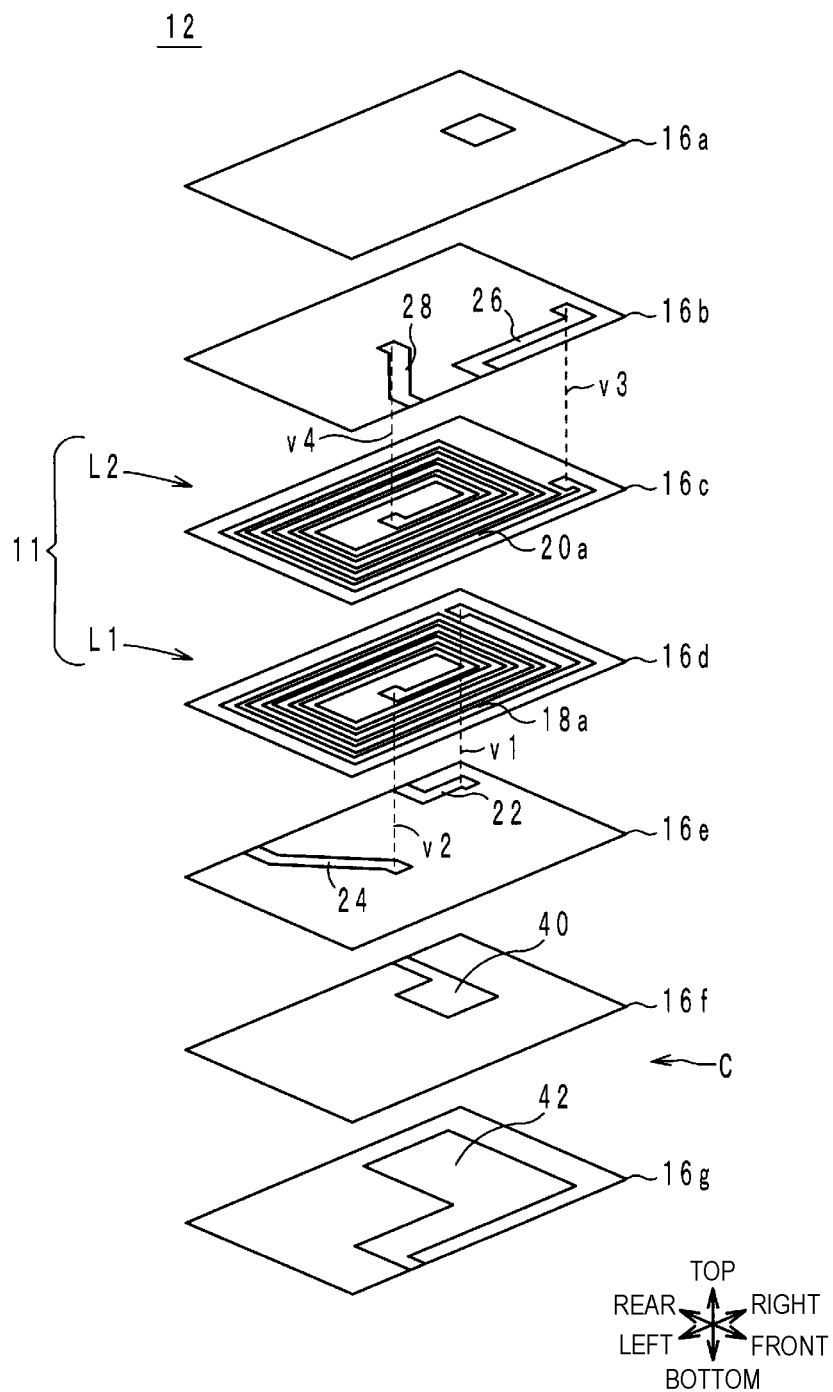
FIG. 3 is an exploded perspective view of a multilayer body of the balun transformer according to the first preferred embodiment of the present invention.

The specific configuration of the balun transformer $10a$ will now be described below with reference to the drawings. FIG. 2 is an external perspective view of the balun transformer $10a$ according to a first preferred embodiment of the present invention. FIG. 3 is an exploded perspective view of a multilayer body 12 of the balun transformer $10a$ according to the first preferred embodiment. Hereinafter, the stacking direction of the balun transformer $10a$ is defined as a top-bottom direction, the longitudinal direction of the balun transformer $10a$, as viewed from above, is defined as a right-left direction, and the widthwise direction of the balun transformer $10a$, as viewed from above, is defined as a front-rear direction.

As shown in FIGS. 2 and 3, the balun transformer $10a$ includes the converter 11, the multilayer body 12, outer terminals $14a$ through $14f$, and the capacitor C.

The multilayer body 12 includes insulating layers $16a$ through $16g$ stacked on each other in this order from the top side to the bottom side, and preferably has a rectangular or substantially rectangular parallelepiped shape. The insulating layers $16a$ through $16g$ preferably has a rectangular or substantially rectangular shape and are made of a dielectric material, for example, a Ba—Al—Si dielectric ceramic material. Hereinafter, the upper surfaces of the insulating layers 16a through 16g will be referred to as "top surfaces", and the lower surfaces thereof will be referred to as "bottom surfaces".

The outer terminal 14a is an input terminal. The outer terminals 14b and 14c are output terminals. The outer terminals 14d through 14f are ground terminals. The outer terminals 14c, 14d, and 14e are disposed on the front surface of the multilayer body 12 and are arranged from the left side to the right side in this order. The outer terminals 14b, 14f, and 14a are disposed on the rear surface of the multilayer body 12 and are arranged from the left side to the right side in this order. The outer terminals 14a through 14f extend in the top-bottom direction, and both ends of each of the outer terminals 14a through 14f bend to the top and bottom surfaces of the multilayer body 12.

The converter 11 includes the signal lines L1 and L2, as discussed above. As shown in FIG. 3, the signal line L1 includes a coil conductor 18a, extended conductors 22 and 24, and via-hole conductors v1 and v2. The coil conductor 18a is disposed on the top surface of the insulating layer 16d and preferably has a spiral shape in which it advances toward the center while turning around clockwise, as viewed from above.

The extended conductor 22 is a linear conductor disposed on the top surface of the insulating layer 16e. One end of the extended conductor 22 is superposed on the outer peripheral end portion of the coil conductor 18a, as viewed from above, while the other end of the extended conductor 22 is connected to the outer terminal 14a. The via-hole conductor v1 passes through the insulating layer 16d in the top-bottom direction, and connects the outer peripheral end portion of the coil conductor 18a and one end of the extended conductor 22 with each other. With this configuration, the signal line L1 is connected between the outer terminals 14a and 14b.

The extended conductor 24 is a linear conductor disposed on the top surface of the insulating layer 16e. One end of the extended conductor 24 is superposed on the inner peripheral end portion of the coil conductor 18a, as viewed from above, while the other end of the extended conductor 24 is connected to the outer terminal 14b. The via-hole conductor v2 passes through the insulating layer 16d in the top-bottom direction, and connects the inner peripheral end portion of the coil conductor 18a and one end of the extended conductor 24 with each other.

As shown in FIG. 3, the signal line L2 includes a coil conductor 20a, extended conductors 26 and 28, and via-hole conductors v3 and v4. The coil conductor 20a is disposed on the top surface of the insulating layer 16c and preferably has a spiral shape in which it advances toward the center while turning around clockwise, as viewed from above. The coil conductor 20a is superposed on the coil conductor 18a, as viewed from above. That is, the coil conductors 18a and 20a oppose each other with the insulating layer 16c interposed therebetween. With this configuration, the coil conductors 18a and 20a are electromagnetically coupled with each other.

The extended conductor 26 is a linear conductor disposed on the top surface of the insulating layer 16b. One end of the extended conductor 26 is superposed on the outer peripheral end portion of the coil conductor 20a, as viewed from above, while the other end of the extended conductor 26 is connected to the outer terminal 14d. The via-hole conductor v3 passes through the insulating layer 16b in the top-bottom direction, and connects the outer peripheral end portion of the coil conductor 20a and one end of the extended conductor 26 with each other.

The extended conductor 28 is a linear conductor disposed on the top surface of the insulating layer 16b. One end of the extended conductor 28 is superposed on the inner peripheral end portion of the coil conductor 20a, as viewed from above, while the other end of the extended conductor 28 is connected to the outer terminal 14c. The via-hole conductor v4 passes through the insulating layer 16b in the top-bottom direction, and connects the inner peripheral end portion of the coil conductor 20a and one end of the extended conductor 28 with each other. With this configuration, the signal line L2 is connected between the outer terminals 14c and 14d.

The capacitor C includes capacitor conductors 40 and 42. The capacitor conductor 40 is disposed on the top surface of the insulating layer 16f and preferably has a rectangular or substantially rectangular shape. The capacitor conductor 40 is connected to the outer terminal 14a.

The capacitor conductor 42 is disposed on the top surface of the insulating layer 16g and preferably has a rectangular or substantially rectangular shape. The capacitor conductor 42 is connected to the outer terminal 14c. The capacitor conductors 40 and 42 oppose each other with the insulating layer 16f interposed therebetween. Accordingly, a capacitance is provided between the capacitor conductors 40 and 42. With this configuration, the capacitor C is connected between the outer terminals 14a and 14c.

In the balun transformer 10a with the structure described above, it is possible to improve balance characteristics. Details will be given below. An unbalanced signal is input into the balun transformer 10a via the outer terminal 14a, and a balanced signal is output from the balun transformer 10a via the outer terminals 14b and 14c. Hereinafter, a signal input into the outer terminal 14a will be referred to as an "input signal", a signal output from the outer terminal 14b will be referred to as a "first output signal", and a signal output from the outer terminal 14c will be referred to as a "second output signal".

An input signal is input into the signal line L1 and the capacitor C via the outer terminal 14a. The input signal, which is an unbalanced signal, input into the signal line L1 is converted into a balanced signal in the converter 11. This will be discussed more specifically. The signal line L1 includes the coil conductor 18a, and the coil conductor 18a produces a 90° phase lag for the voltage of a signal passing through the coil conductor 18a. Accordingly, the voltage of a signal output from the signal line L1 (that is, the first output signal) has a 90° phase lag with respect to that of the input signal.

Since the signal lines L1 and L2 are electromagnetically coupled with each other, electromagnetic induction is generated therebetween. Accordingly, there is a 18° phase difference between the voltage of a signal output from the signal line L1 and that from the signal line L2. That is, the voltage of a signal output from the signal line L1 has a 90° phase lag with respect to that of the input signal, and the voltage of a signal output from the signal line L2 has a 270° phase lag (90° phase lead) with respect to that of the input signal.

Meanwhile, the input signal input into the capacitor C passes through the capacitor C and joins the signal output from the signal line L2. The capacitor C produces a 90° phase lead for the voltage of a signal passing through the capacitor C. Accordingly, the voltage of a signal passing through the capacitor C has a 90° phase lead with respect to that of the input signal. That is, the voltage of the signal passing through the capacitor C is in phase with that output from the signal line L2. With this configuration, the amplitude of the second output signal output from the outer terminal 14c is increased. That is, in the balun transformer 10a, it is easy to make the amplitude of the second output signal approximate to that of the first output signal, thus making it possible to improve balance characteristics.

In the balun transformer 10a, since the insulating layers 16a through 16g are made of a dielectric material, the balun transformer 10a may be used in a wide band (for example, about 700 MHz to about 2.7 GHz) including a radio frequency band of about 2 GHz or higher, for example. This will be discussed more specifically. If the insulating layers 16a through 16g are made of a magnetic material, upon input of a radio frequency signal of 2 GHz or higher, the relative permeability of the insulating layers 16a through 16g sharply drops and approximates to 1. Because of this reason, a sufficient degree of electromagnetic coupling between the signal lines L1 and L2 is not obtained, thus decreasing the amplitude of the second output signal. That is, in the balun transformer 10a including insulating layers 16a through 16g made of a magnetic material, the balance characteristics are significantly decreased in a radio frequency band of 2 GHz. Thus, if the balun transformer 10a including insulating layers 16a through 16g made of a magnetic material is used in a wide band (for example, about 700 MHz to about 2.7 GHz) including a radio frequency band of about 2 GHz or higher, the balance characteristics significantly vary according to the frequency band, for example.

In view of this problem, in the balun transformer 10a, the insulating layers 16a through 16g are made of a dielectric material. The relative permeability of a dielectric material is less likely to change according to the frequency band than that of a magnetic material, and also, the value of the permeability is small. Thus, if the balun transformer 10a including insulating layers 16a through 16g made of a dielectric material is used in a wide band (for example, about 700 MHz to about 2.7 GHz) including a radio frequency band of about 2 GHz or higher, for example, the balance characteristics are less likely to change according to the frequency band. Thus, since the relative permeability of the insulating layers 16a through 16g is small, a sufficient degree of electromagnetic coupling between the signal lines L1 and L2 is not obtained. As a result, the amplitude of the second output signal is decreased. However, since the capacitor C is provided between the outer terminals 14a and 14c, the amplitude of the second output signal approximates to that of the first output signal. In the balun transformer 10a, since the insulating layers 16a through 16g are made of a dielectric material, the balun transformer 10a may be used in a wide band (for example, about 700 MHz to about 2.7 GHz) including a radio frequency band of about 2 GHz or higher, for example. This does not however exclude the use of a magnetic material for the insulating layers 16a through 16g.

In the multilayer transformer component disclosed in International Publication No. 2008/105213, in order to intensify the electromagnetic coupling between a primary coil and a secondary coil, the primary coil and the secondary coil preferably are formed narrow by using, for example, a photolithographic technique. However, this makes the manufacturing process complicated and thus increases the manufacturing cost of the multilayer transformer component.

In contrast, in the balun transformer 10a according to this preferred embodiment, the capacitor C is provided between the outer terminals 14a and 14c. Accordingly, even if electromagnetic coupling between the signal lines L1 and L2 is relatively weak, excellent balance characteristics are obtained. This eliminates the need to form the signal lines L1 and L2 by using a photolithographic technique in order to intensify the electromagnetic coupling between the signal lines L1 and L2. That is, it is possible to form the balun transformer 10a by stacking green sheets on which conductors are formed by screen printing. As a result, it is possible to reduce the manufacturing cost of the balun transformer 10a. This does not however exclude the use of a photolithographic technique for forming the signal lines L1 and L2 of the balun transformer 10a.

The inventor of the present application conducted the following computer simulations for clarifying the advantages achieved by the balun transformer 10a. This will be discussed more specifically. The balun transformer 10a shown in FIG. 1 was created as a first model, and the balun transformer 10a shown in FIG. 1 from which the capacitor C was removed was created as a second model. Then, the balance characteristics of the first model and those of the second model were calculated. In this case, the balance characteristics indicate the difference between the amplitude of the first output signal and that of the second output signal (hereinafter simply referred to as the "amplitude difference") and the difference between the phase of the voltage of the first output signal and that of the second output signal (hereinafter simply referred to as the "phase difference"). High balance characteristics mean that the amplitude difference is close to 0 dB and the phase difference is close to 180°.

Figure 4:
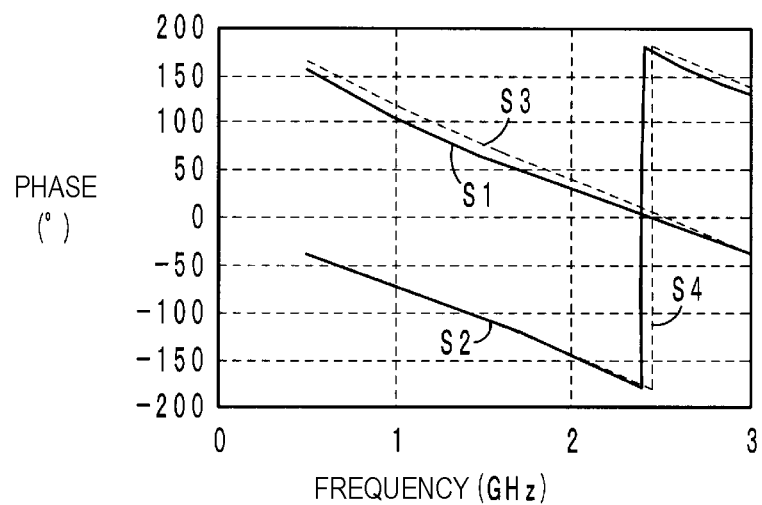
FIG. 4 is a graph illustrating the relationship between the frequency and the phase.
Figure 5:
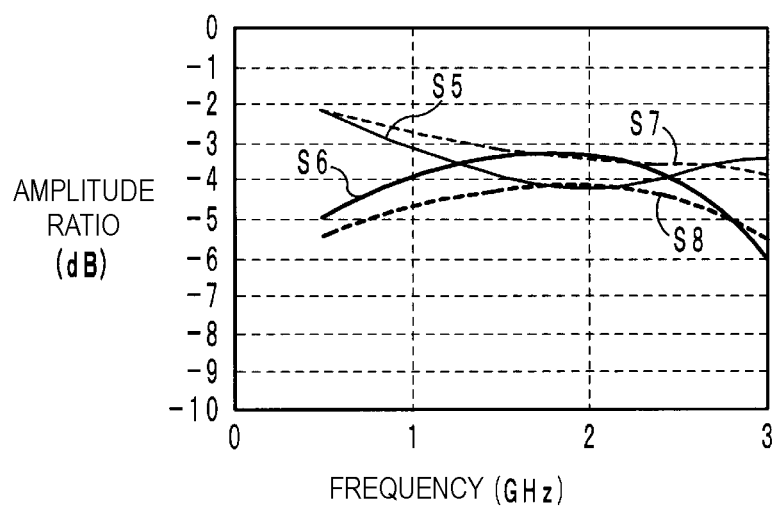
FIG. 5 is a graph illustrating the relationship between the frequency and the amplitude ratio.

FIG. 4 is a graph illustrating the relationship between the frequency and the phase. The vertical axis indicates the phase, and the horizontal axis indicates the frequency. FIG. 5 is a graph illustrating the relationship between the frequency and the amplitude. The vertical axis indicates the amplitude ratio, and the horizontal axis indicates the frequency.

In FIG. 4, the solid line S1 indicates the phase of the voltage of the first output signal in the first model, and the solid line S2 indicates the phase of the voltage of the second output signal in the first model. The broken line S3 indicates the phase of the voltage of the first output signal in the second model, and the broken line S4 indicates the phase of the voltage of the second output signal in the second model.

As shown in FIG. 4, the phase difference between the solid lines S1 and S2 is maintained at substantially 180° even if the frequency changes, as in the phase difference between the broken lines S3 and S4. Accordingly, the balun transformer 10a exhibits balance characteristics excellent in the phase difference.

In FIG. 5, the solid line S5 indicates the value of the ratio of the amplitude of the first output signal to that of the input signal in the first model. The solid line S6 indicates the value of the ratio of the amplitude of the second output signal to that of the input signal in the first model. The broken line S7 indicates the value of the ratio of the amplitude of the first output signal to that of the input signal in the second model. The broken line S8 indicates the value of the ratio of the amplitude of the second output signal to that of the input signal in the second model.

As shown in FIG. 5, the solid line S6 in the first model is located farther upward than the broken line S8 in the second model. That is, it is seen that the amplitude of the second output signal in the first model is greater than that of the second output signal in the second model. In other words, by the provision of the capacitor C, the amplitude of the second output signal in the first model becomes greater than that in the second model.

The solid line S5 in the first model is located farther downward than the broken line S7 in the second model. That is, it is seen that the amplitude of the first output signal in the first model is smaller than that of the first output signal in the second model. In other words, in the first model, by the provision of the capacitor C, the amplitude of the first output signal is decreased by the amount by which the second output signal is increased. It is thus possible that the amplitude of the first output signal and that of the second output signal approximate to each other. Accordingly, the balun transformer 10a exhibits balance characteristics excellent in the amplitude difference.

Figure 6:
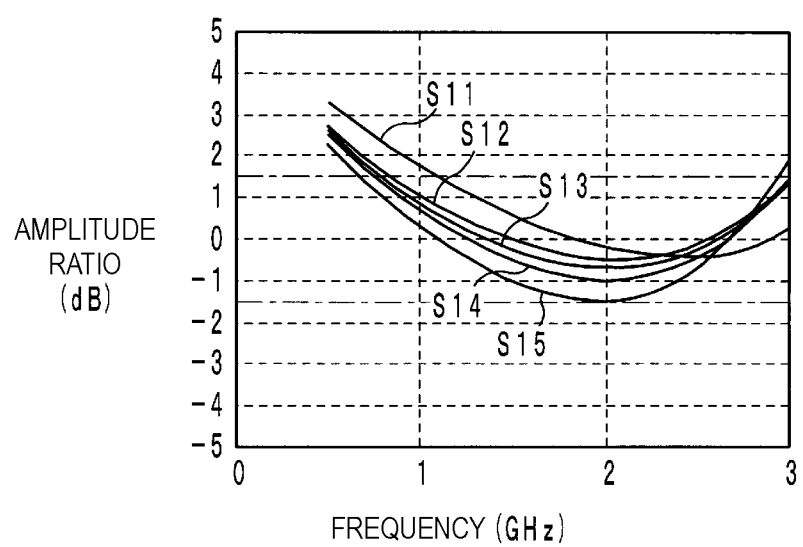
FIG. 6 is a graph illustrating the relationship between the frequency and the amplitude ratio.

Then, the inventor of the present application conducted the following computer simulations for examining a suitable magnitude of the capacitor C. More specifically, in the first model, by varying the capacitance of the capacitor C to 0 pF, about 0.16 pF, about 0.2 pF, about 0.25 pF, and about 0.32 pF, the relationship between the frequency and the amplitude ratio was calculated. The amplitude ratio is the value of the ratio of the amplitude of the first output signal to that of the second output signal. In the simulations, the interval between the coil conductors 18a and 20a in the vertical direction (stacking direction) was set to be about 25 μm. FIG. 6 is a graph illustrating the relationship between the frequency and the amplitude ratio. The vertical axis indicates the amplitude ratio, and the horizontal axis indicates the frequency.

The solid line S11 indicates the relationship between the frequency and the amplitude ratio when the capacitor C has 0 pF. The solid line S12 indicates the relationship between the frequency and the amplitude ratio when the capacitor C has about 0.16 pF. The solid line S13 indicates the relationship between the frequency and the amplitude ratio when the capacitor C has about 0.2 pF. The solid line S14 indicates the relationship between the frequency and the amplitude ratio when the capacitor C has about 0.25 pF. The solid line S15 indicates the relationship between the frequency and the amplitude ratio when the capacitor C has about 0.32 pF.

FIG. 6 shows that, as the capacitance of the capacitor C is increased, the amplitude ratio is decreased. That is, as the capacitance of the capacitor C is increased, the amplitude of the first output signal is decreased and the amplitude of the second output signal is increased. In the balun transformer 10a, it is desirable that the amplitude ratio be contained within about ±1.5 dB in the frequency band of about 700 MHz to about 2.7 GHz, for example. Accordingly, FIG. 6 shows that the capacitance of the capacitor C is desirably 0.24 pF±30% (0.08 pF).

First Modified Example

Figure 7:
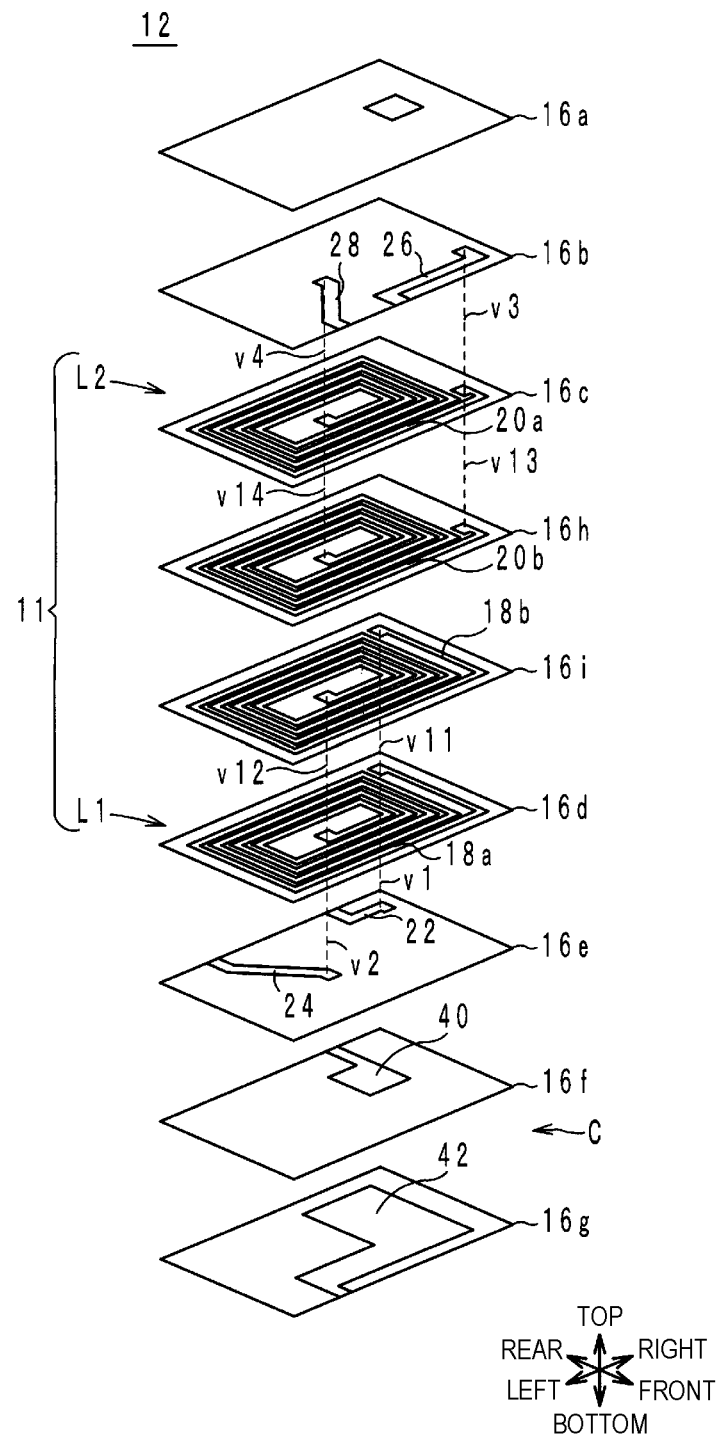
FIG. 7 is an exploded perspective view of a multilayer body of a balun transformer according to a first modified example of a preferred embodiment of the present invention.

A balun transformer 10b according to a first modified example of a preferred embodiment of the present invention will be described below with reference to the drawings. FIG. 7 is an exploded perspective view of a multilayer body 12 of the balun transformer 10b according to the first modified example. The circuit configuration of the balun transformer 10b is the same as that of the balun transformer 10a, and thus, FIG. 1 is used for explaining the balun transformer 10b. The external perspective view of the balun transformer 10b is the same as that of the balun transformer 10a, and thus, FIG. 2 is used for explaining the balun transformer 10b.

The balun transformer 10b is different from the balun transformer 10a in that it includes insulating layers 16h and 16i, coil conductors 18b and 20b, and via-hole conductors v11 through v14.

The insulating layers 16h and 16i are disposed between the insulating layers 16c and 16d. The coil conductor 18b is disposed on the top surface of the insulating layer 16i and has the same configuration as the coil conductor 18a. The via-hole conductor v11 passes through the insulating layer 16i in the top-bottom direction, and connects the outer peripheral end portion of the coil conductor 18a and the outer peripheral end portion of the coil conductor 18b with each other. The via-hole conductor v12 passes through the insulating layer 16i in the top-bottom direction, and connects the inner peripheral end portion of the coil conductor 18a and the inner peripheral end portion of the coil conductor 18b with each other. With this configuration, the coil conductors 18a and 18b are connected in parallel with each other.

The coil conductor 20b is disposed on the top surface of the insulating layer 16h and has the same configuration as the coil conductor 20a. The via-hole conductor v13 passes through the insulating layer 16c in the top-bottom direction, and connects the outer peripheral end portion of the coil conductor 20a and the outer peripheral end portion of the coil conductor 20b with each other. The via-hole conductor v14 passes through the insulating layer 16c in the top-bottom direction, and connects the inner peripheral end portion of the coil conductor 20a and the inner peripheral end portion of the coil conductor 20b with each other. With this configuration, the coil conductors 20a and 20b are connected in parallel with each other.

In the balun transformer 10b with the structure described above, it is possible to improve balance characteristics, as in the balun transformer 10a.

In the balun transformer 10b, since the coil conductors 18a and 18b are connected in parallel with each other, the direct current resistance of the signal line L1 is decreased. Similarly, since the coil conductors 20a and 20b are connected in parallel with each other, the direct current resistance of the signal line L2 is decreased. It is thus possible to enhance the bandpass characteristic of the balun transformer 10b.

Second Modified Example

Figure 8:
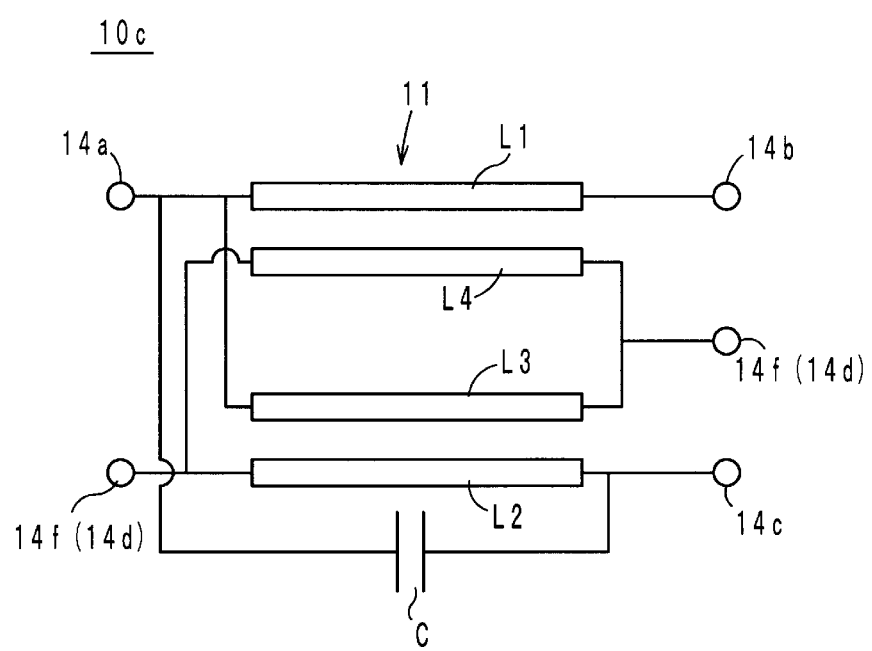
FIG. 8 is a circuit diagram of a balun transformer according to a second modified example of a preferred embodiment of the present invention.

A balun transformer according to a second modified example of a preferred embodiment of the present invention will be described below with reference to the drawings. FIG. 8 is a circuit diagram of a balun transformer 10c according to the second modified example.

As shown in FIG. 8, the balun transformer 10c includes a converter 11, a capacitor C, and outer terminals 14a through 14c and 14f. The converter 11 includes signal lines L1 through L4.

The signal line L1 is connected between the outer terminals 14a and 14b. The signal line L2 is connected between the outer terminals 14c and 14f. The signal line L3 is connected between the outer terminals 14a and 14f. With this configuration, one end of the signal line L1 and one end of the signal line L3 are connected to each other. The signal line L4 is connected between the outer terminals 14f. With this configuration, one end of the signal line L2 and one end of the signal line L4 are connected to each other.

The signal lines L1 and L4 are electromagnetically coupled with each other. The signal lines L2 and L3 are electromagnetically coupled with each other. The capacitor C is connected between the outer terminals 14a and 14c.

In the balun transformer 10c with the structure described above, the outer terminal 14a is an input terminal into which an unbalanced signal is input, the outer terminals 14b and 14c are output terminals from which a balanced signal is output, and the outer terminals 14f are ground terminals to be grounded.

Figure 9:
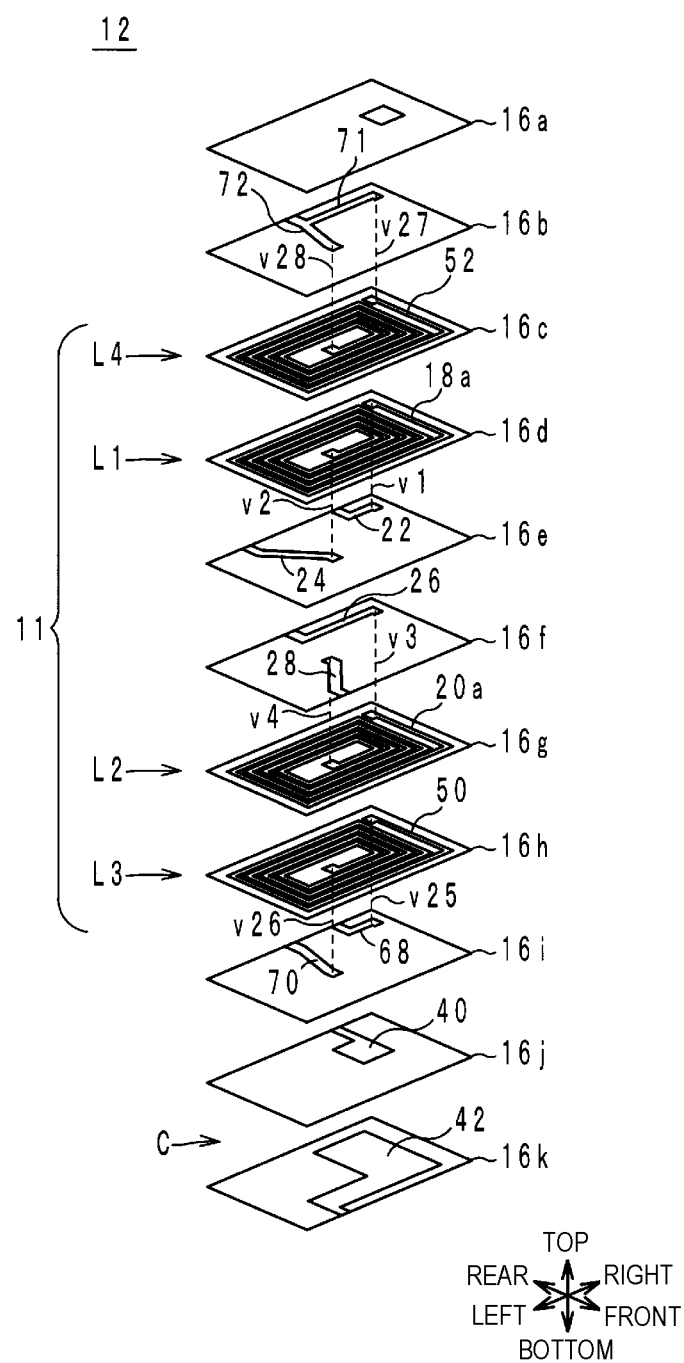
FIG. 9 is an exploded perspective view of a multilayer body of the balun transformer according to the second modified example of a preferred embodiment of the present invention.

The specific configuration of the balun transformer 10c will be described below with reference to the drawings. FIG. 9 is an exploded perspective view of a multilayer body 12 of the balun transformer 10c according to the second modified example. The external perspective view of the balun transformer 10c is the same as that of the balun transformer 10a, and thus, FIG. 2 is used for explaining the balun transformer 10c.

As shown in FIGS. 2 and 9, the balun transformer 10c includes the converter 11, the multilayer body 12, the outer terminals 14a through 14f, and the capacitor C.

The multilayer body 12 includes insulating layers 16a through 16k stacked on each other in this order from the top side to the bottom side, and preferably has a rectangular or substantially rectangular parallelepiped shape. The insulating layers 16a through 16k preferably haves a rectangular or substantially rectangular shape and are made of a dielectric material, for example, a Ba—Al—Si dielectric ceramic. Hereinafter, the upper surfaces of the insulating layers 16a through 16k will be referred to as "top surfaces", and the lower surfaces thereof will be referred to as "bottom surfaces".

The outer terminals 14a through 14f of the balun transformer 10c are the same as those of the balun transformer 10a, and an explanation thereof will thus be omitted.

The converter 11 includes the signal lines L1 through L4, as discussed above. As shown in FIG. 9, the signal line L1 includes a coil conductor 18a, extended conductors 22 and 24, and via-hole conductors v1 and v2. The coil conductor 18a is disposed on the top surface of the insulating layer 16d and preferably has a spiral shape in which it advances toward the center while turning around clockwise, as viewed from above.

The extended conductor 22 is a linear conductor disposed on the top surface of the insulating layer 16e. One end of the extended conductor 22 is superposed on the outer peripheral end portion of the coil conductor 18a, as viewed from above, while the other end of the extended conductor 22 is connected to the outer terminal 14a. The via-hole conductor v1 passes through the insulating layer 16d in the top-bottom direction, and connects the outer peripheral end portion of the coil conductor 18a and one end of the extended conductor 22 with each other.

The extended conductor 24 is a linear conductor disposed on the top surface of the insulating layer 16e. One end of the extended conductor 24 is superposed on the inner peripheral end portion of the coil conductor 18a, as viewed from above, while the other end of the extended conductor 24 is connected to the outer terminal 14b. The via-hole conductor v2 passes through the insulating layer 16d in the top-bottom direction, and connects the inner peripheral end portion of the coil conductor 18a and one end of the extended conductor 24 with each other. With this configuration, the signal line L1 is connected between the outer terminals 14a and 14b.

As shown in FIG. 9, the signal line L4 includes a coil conductor 52, extended conductors 71 and 72, and via-hole conductors v27 and v28. The coil conductor 52 is disposed on the top surface of the insulating layer 16c and preferably has a spiral shape in which it advances toward the center while turning around clockwise, as viewed from above. The coil conductor 52 is superposed on the coil conductor 18a, as viewed from above. That is, the coil conductors 18a and 52 oppose each other with the insulating layer 16c interposed therebetween. With this configuration, the coil conductors 18a and 52 are electromagnetically coupled with each other.

The extended conductor 71 is a linear conductor disposed on the top surface of the insulating layer 16b. One end of the extended conductor 71 is superposed on the outer peripheral end portion of the coil conductor 52, as viewed from above, while the other end of the extended conductor 71 is connected to the outer terminal 14f. The via-hole conductor v27 passes through the insulating layer 16b in the top-bottom direction, and connects the outer peripheral end portion of the coil conductor 52 and one end of the extended conductor 71 with each other.

The extended conductor 72 is a linear conductor disposed on the top surface of the insulating layer 16b. One end of the extended conductor 72 is superposed on the inner peripheral end portion of the coil conductor 52, as viewed from above, while the other end of the extended conductor 72 is connected to the outer terminal 14f. The via-hole conductor v28 passes through the insulating layer 16b in the top-bottom direction, and connects the inner peripheral end portion of the coil conductor 52 and one end of the extended conductor 72 with each other. With this configuration, the signal line L4 is connected between the outer terminals 14f.

As shown in FIG. 9, the signal line L2 includes a coil conductor 20a, extended conductors 26 and 28, and via-hole conductors v3 and v4. The coil conductor 20a is disposed on the top surface of the insulating layer 16g and preferably has a spiral shape in which it advances toward the center while turning around clockwise, as viewed from above.

The extended conductor 26 is a linear conductor disposed on the top surface of the insulating layer 16f. One end of the extended conductor 26 is superposed on the outer peripheral end portion of the coil conductor 20a, as viewed from above, while the other end of the extended conductor 26 is connected to the outer terminal 14f. The via-hole conductor v3 passes through the insulating layer 16f in the top-bottom direction, and connects the outer peripheral end portion of the coil conductor 20a and one end of the extended conductor 26 with each other. With this configuration, the signal line L2 is connected between the outer terminals 14c and 14f.

The extended conductor 28 is a linear conductor disposed on the top surface of the insulating layer 16f. One end of the extended conductor 28 is superposed on the inner peripheral end portion of the coil conductor 20a, as viewed from above, while the other end of the extended conductor 28 is connected to the outer terminal 14c. The via-hole conductor v4 passes through the insulating layer 16f in the top-bottom direction, and connects the inner peripheral end portion of the coil conductor 20a and one end of the extended conductor 28 with each other.

As shown in FIG. 9, the signal line L3 includes a coil conductor 50, extended conductors 68 and 70, and via-hole conductors v25 and v26. The coil conductor 50 is disposed on the top surface of the insulating layer 16h and preferably has a spiral shape in which it advances toward the center while turning around clockwise, as viewed from above. The coil conductor 50 is superposed on the coil conductor 20a, as viewed from above. That is, the coil conductors 20a and 50 oppose each other with the insulating layer 16g interposed therebetween. With this configuration, the coil conductors 20a and 50 are electromagnetically coupled with each other.

The extended conductor 68 is a linear conductor disposed on the top surface of the insulating layer 16i. One end of the extended conductor 68 is superposed on the outer peripheral end portion of the coil conductor 50, as viewed from above, while the other end of the extended conductor 68 is connected to the outer terminal 14a. The via-hole conductor v25 passes through the insulating layer 16h in the top-bottom direction, and connects the outer peripheral end portion of the coil conductor 50 and one end of the extended conductor 68 with each other.

The extended conductor 70 is a linear conductor disposed on the top surface of the insulating layer 16i. One end of the extended conductor 70 is superposed on the inner peripheral end portion of the coil conductor 50, as viewed from above, while the other end of the extended conductor 70 is connected to the outer terminal 14f. The via-hole conductor v26 passes through the insulating layer 16h in the top-bottom direction, and connects the inner peripheral end portion of the coil conductor 50 and one end of the extended conductor 70 with each other. With this configuration, the signal line L3 is connected between the outer terminals 14a and 14f.

The capacitor C includes capacitor conductors 40 and 42. The capacitor conductor 40 is disposed on the top surface of the insulating layer 16j and preferably has a rectangular or substantially rectangular shape. The capacitor conductor 40 is connected to the outer terminal 14a.

The capacitor conductor 42 is disposed on the top surface of the insulating layer 16k and preferably has a rectangular or substantially rectangular shape. The capacitor conductor 42 is connected to the outer terminal 14c. The capacitor conductors 40 and 42 oppose each other with the insulating layer 16j interposed therebetween. Accordingly, a capacitance is provided between the capacitor conductors 40 and 42. With this configuration, the capacitor C is connected between the outer terminals 14a and 14c.

In the balun transformer 10c with the structure described above, it is possible to improve balance characteristics, as in the balun transformer 10a.

In the balun transformer 10c, by electromagnetically coupling the signal lines L1 and L4 with each other and the signal lines L2 and L3 with each other, impedance transformation is able to be performed. More specifically, in the balun transformer 10c, the characteristic impedance of the output side can be set to be four times as high as that of the input side.

Third Modified Example

Figure 10:
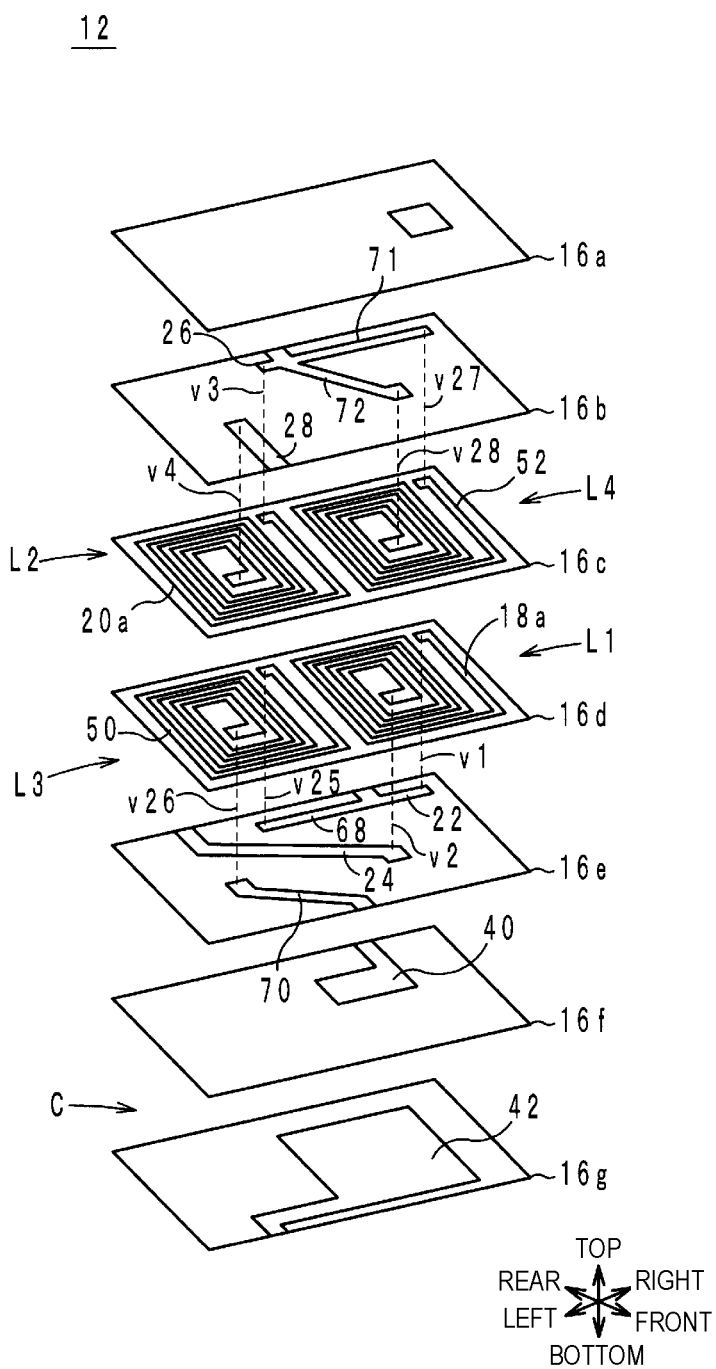
FIG. 10 is an exploded perspective view of a multilayer body of a balun transformer according to a third modified example of a preferred embodiment of the present invention.

A balun transformer 10d according to a third modified example of a preferred embodiment of the present invention will be described below with reference to the drawings. FIG. 10 is an exploded perspective view of a multilayer body 12 of the balun transformer 10d according to the third modified example. The circuit configuration of the balun transformer 10d is the same as that of the balun transformer 10c, and thus, FIG. 8 is used for explaining the balun transformer 10d. The external perspective view of the balun transformer 10d is the same as that of the balun transformer 10a, and thus, FIG. 2 is used for explaining the balun transformer 10d.

The balun transformer 10d is different from the balun transformer 10c in the arrangement of the signal lines L1 through L4. This will be discussed more specifically. In the balun transformer 10c, the signal lines L4, L1, L2, and L3 are arranged in this order from the top side to the bottom side. On the other hand, in the balun transformer 10d, the coil conductor 18a of the signal line L1 and the coil conductor 50 of the signal line L3 are disposed on the same insulating layer 16d, and the coil conductor 20a of the signal line L2 and the coil conductor 52 of the signal line L4 are disposed on the same insulating layer 16c. The coil conductor 18a of the signal line L1 and the coil conductor 52 of the signal line L4 oppose each other with the insulating layer 16c interposed therebetween so as to be electromagnetically coupled with each other. The coil conductor 20a of the signal line L2 and the coil conductor 20a of the signal line L3 oppose each other with the insulating layer 16c interposed therebetween so as to be electromagnetically coupled with each other.

In the balun transformer 10d with the structure described above, it is possible to improve balance characteristics, as in the balun transformer 10a.

In the balun transformer 10d, it is possible to perform impedance transformation, as in the balun transformer 10c.

In the balun transformer 10d, since the coil conductors 18a and 50 are disposed on the same insulating layer 16d, it is less likely that a capacitance will be generated between the coil conductors 18a and 50. Similarly, since the coil conductors 20a and 52 are disposed on the same insulating layer 16c, it is less likely that a capacitance will be generated between the coil conductors 20a and 52. Accordingly, it is possible to suppress or prevent the formation of an unwanted capacitance in the balun transformer 10d.

In the balun transformer 10d, the coil conductors 18a, 20a, 50, and 52 are disposed on the two insulating layers 16c and 16d. Accordingly, it is possible to decrease the height of the balun transformer 10d to be smaller than that of a balun transformer in which the coil conductors 18a, 20a, 50, and 52 are disposed on four different insulating layers.

Fourth Modified Example

Figure 11:
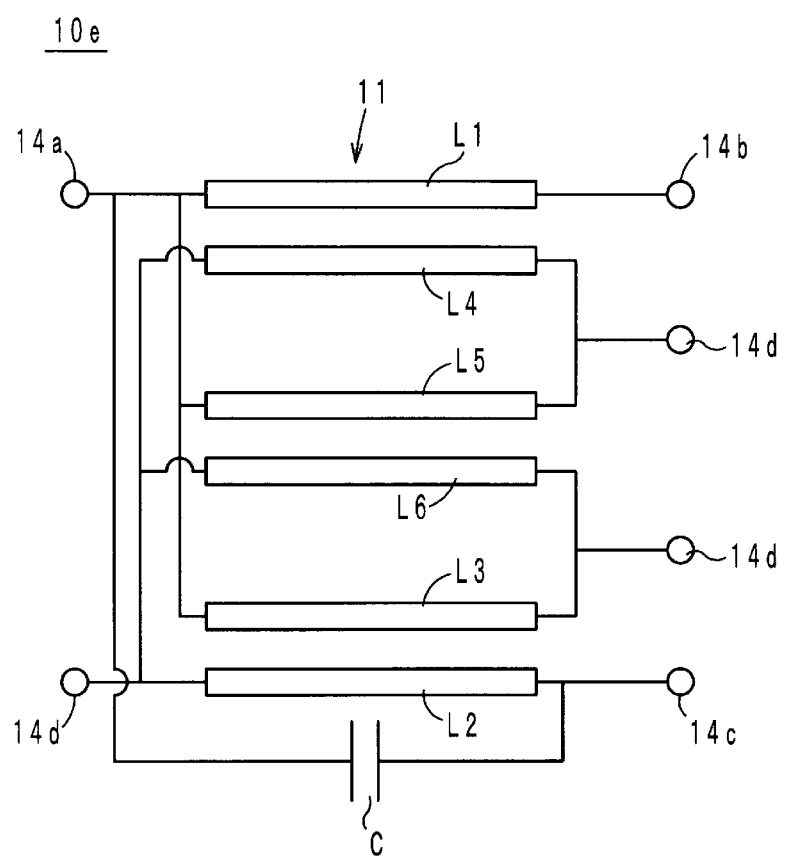
FIG. 11 is a circuit diagram of a balun transformer according to a fourth modified example of a preferred embodiment of the present invention.

A balun transformer according to a fourth modified example of a preferred embodiment of the present invention will be described below with reference to the drawings. FIG. 11 is a circuit diagram of a balun transformer 10e according to the fourth modified example.

As shown in FIG. 11, the balun transformer 10e includes a converter 11, a capacitor C, and outer terminals 14a through 14d. The converter 11 includes signal lines L1 through L6.

The signal line L1 is connected between the outer terminals 14a and 14b. The signal line L2 is connected between the outer terminals 14c and 14d. The signal line L3 is connected between the outer terminals 14a and 14d. With this configuration, one end of the signal line L1 and one end of the signal line L3 are connected to each other. The signal line L4 is connected between the outer terminals 14d. With this configuration, one end of the signal line L2 and one end of the signal line L4 are connected to each other. The signal line L5 is connected between the outer terminals 14a and 14d. With this configuration, one end of the signal line L1 and one end of the signal line L5 are connected to each other. The signal line L6 is connected between the outer terminals 14d. With this configuration, one end of the signal line L2 and one end of the signal line L6 are connected to each other.

The signal lines L1 and L4 are electromagnetically coupled with each other. The signal lines L2 and L3 are electromagnetically coupled with each other. The signal lines L5 and L6 are electromagnetically coupled with each other. The capacitor C is connected between the outer terminals 14a and 14c.

In the balun transformer 10e with the structure described above, the outer terminal 14a is an input terminal into which an unbalanced signal is input, the outer terminals 14b and 14c are output terminals from which a balanced signal is output, and the outer terminals 14d are ground terminals to be grounded.

Figure 12:
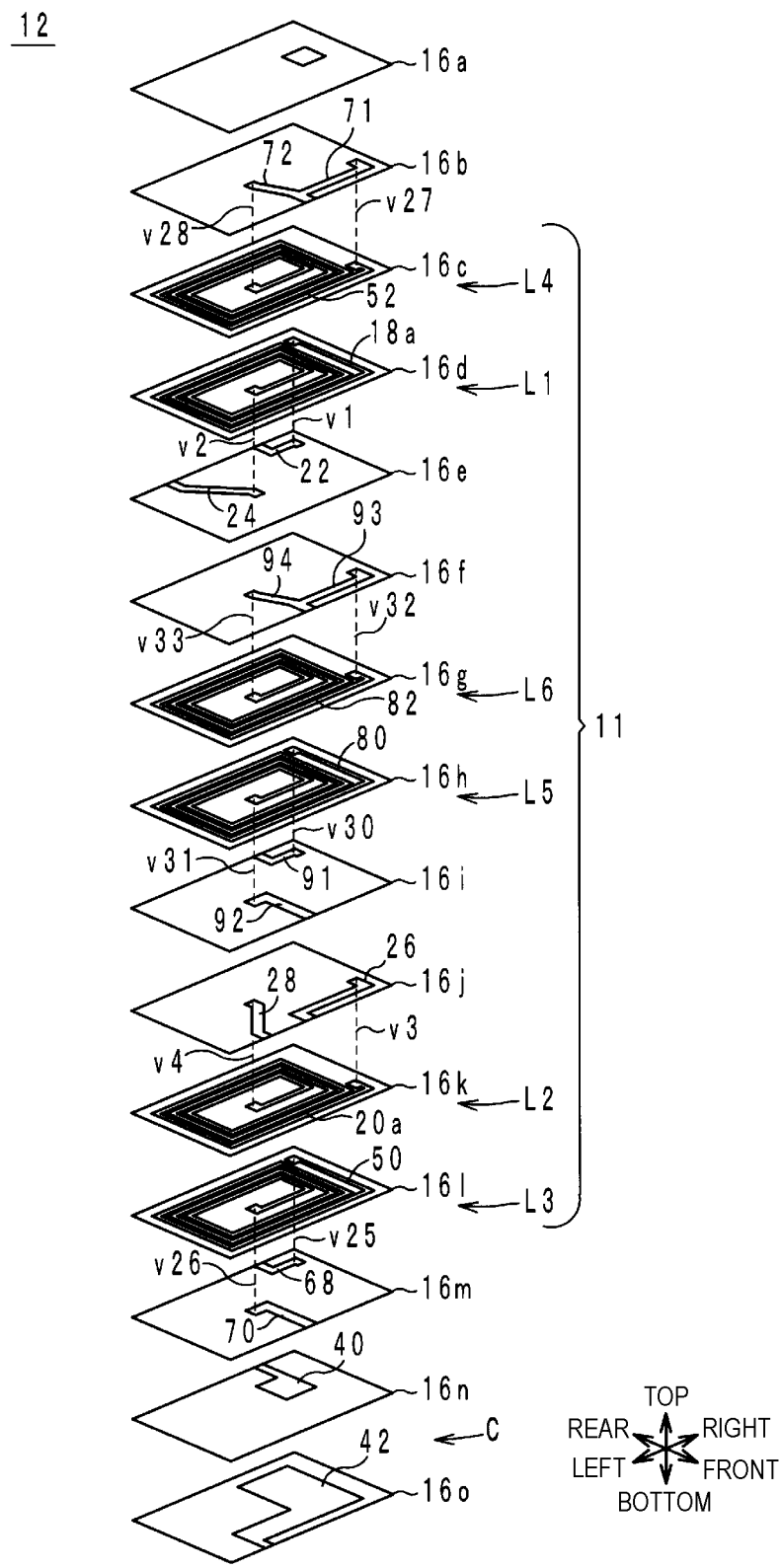
FIG. 12 is an exploded perspective view of a multilayer body of the balun transformer according to the fourth modified example of a preferred embodiment of the present invention.

The specific configuration of the balun transformer 10e will be described below with reference to the drawings. FIG. 12 is an exploded perspective view of a multilayer body 12 of the balun transformer 10e according to the fourth modified example. The external perspective view of the balun transformer 10e is the same as that of the balun transformer 10a, and thus, FIG. 2 is used for explaining the balun transformer 10e.

As shown in FIGS. 2 and 12, the balun transformer 10e includes the converter 11, the multilayer body 12, the outer terminals 14a through 14f, and the capacitor C.

The multilayer body 12 includes insulating layers 16a through 16o stacked on each other in this order from the top side to the bottom side, and preferably has a rectangular or substantially rectangular parallelepiped shape. The insulating layers 16a through 16o preferably have a rectangular or substantially rectangular shape and are made of a dielectric material, for example, a Ba—Al—Si dielectric ceramic. Hereinafter, the upper surfaces of the insulating layers 16a through 16o will be referred to as "top surfaces", and the lower surfaces thereof will be referred to as "bottom surfaces".

The outer terminals 14a through 14f of the balun transformer 10e are the same as those of the balun transformer 10a, and an explanation thereof will thus be omitted.

The converter 11 includes the signal lines L1 through L6, as discussed above. As shown in FIG. 12, the signal line L1 includes a coil conductor 18a, extended conductors 22 and 24, and via-hole conductors v1 and v2. The coil conductor 18a is disposed on the top surface of the insulating layer 16d and preferably has a spiral shape in which it advances toward the center while turning around clockwise, as viewed from above.

The extended conductor 22 is a linear conductor disposed on the top surface of the insulating layer 16e. One end of the extended conductor 22 is superposed on the outer peripheral end portion of the coil conductor 18a, as viewed from above, while the other end of the extended conductor 22 is connected to the outer terminal 14a. The via-hole conductor v1 passes through the insulating layer 16d in the top-bottom direction, and connects the outer peripheral end portion of the coil conductor 18a and one end of the extended conductor 22 with each other.

The extended conductor 24 is a linear conductor disposed on the top surface of the insulating layer 16e. One end of the extended conductor 24 is superposed on the inner peripheral end portion of the coil conductor 18a, as viewed from above, while the other end of the extended conductor 24 is connected to the outer terminal 14b. The via-hole conductor v2 passes through the insulating layer 16d in the top-bottom direction, and connects the inner peripheral end portion of the coil conductor 18a and one end of the extended conductor 24 with each other. With this configuration, the signal line L1 is connected between the outer terminals 14a and 14b.

As shown in FIG. 12, the signal line L4 includes a coil conductor 52, extended conductors 71 and 72, and via-hole conductors v27 and v28. The coil conductor 52 is disposed on the top surface of the insulating layer 16c and preferably has a spiral shape in which it advances toward the center while turning around clockwise, as viewed from above. The coil conductor 52 is superposed on the coil conductor 18a, as viewed from above. That is, the coil conductors 18a and 52 oppose each other with the insulating layer 16c interposed therebetween. With this configuration, the coil conductors 18a and 52 are electromagnetically coupled with each other.

The extended conductor 71 is a linear conductor disposed on the top surface of the insulating layer 16b. One end of the extended conductor 71 is superposed on the outer peripheral end portion of the coil conductor 52, as viewed from above, while the other end of the extended conductor 71 is connected to the outer terminal 14d. The via-hole conductor v27 passes through the insulating layer 16b in the top-bottom direction, and connects the outer peripheral end portion of the coil conductor 52 and one end of the extended conductor 71 with each other.

The extended conductor 72 is a linear conductor disposed on the top surface of the insulating layer 16b. One end of the extended conductor 72 is superposed on the inner peripheral end portion of the coil conductor 52, as viewed from above, while the other end of the extended conductor 72 is connected to the outer terminal 14d. The via-hole conductor v28 passes through the insulating layer 16b in the top-bottom direction, and connects the inner peripheral end portion of the coil conductor 52 and one end of the extended conductor 72 with each other. With this configuration, the signal line L4 is connected between the outer terminals 14d.

As shown in FIG. 12, the signal line L2 includes a coil conductor 20a, extended conductors 26 and 28, and via-hole conductors v3 and v4. The coil conductor 20a is disposed on the top surface of the insulating layer 16k and preferably has a spiral shape in which it advances toward the center while turning around clockwise, as viewed from above.

The extended conductor 26 is a linear conductor disposed on the top surface of the insulating layer 16j. One end of the extended conductor 26 is superposed on the outer peripheral end portion of the coil conductor 20a, as viewed from above, while the other end of the extended conductor 26 is connected to the outer terminal 14d. The via-hole conductor v3 passes through the insulating layer 16j in the top-bottom direction, and connects the outer peripheral end portion of the coil conductor 20a and one end of the extended conductor 26 with each other.

The extended conductor 28 is a linear conductor disposed on the top surface of the insulating layer 16j. One end of the extended conductor 28 is superposed on the inner peripheral end portion of the coil conductor 20a, as viewed from above, while the other end of the extended conductor 28 is connected to the outer terminal 14c. The via-hole conductor v4 passes through the insulating layer 16j in the top-bottom direction, and connects the inner peripheral end portion of the coil conductor 20a and one end of the extended conductor 28 with each other. With this configuration, the signal line L3 is connected between the outer terminals 14c and 14d.

As shown in FIG. 12, the signal line L3 includes a coil conductor 50, extended conductors 68 and 70, and via-hole conductors v25 and v26. The coil conductor 50 is disposed on the top surface of the insulating layer 16l and preferably has a spiral shape in which it advances toward the center while turning around clockwise, as viewed from above. The coil conductor 50 is superposed on the coil conductor 20a, as viewed from above. That is, the coil conductors 20a and 50 oppose each other with the insulating layer 16k interposed therebetween. With this configuration, the coil conductors 20a and 50 are electromagnetically coupled with each other.

The extended conductor 68 is a linear conductor disposed on the top surface of the insulating layer 16m. One end of the extended conductor 68 is superposed on the outer peripheral end portion of the coil conductor 50, as viewed from above, while the other end of the extended conductor 68 is connected to the outer terminal 14a. The via-hole conductor v25 passes through the insulating layer 16l in the top-bottom direction, and connects the outer peripheral end portion of the coil conductor 50 and one end of the extended conductor 68 with each other.

The extended conductor 70 is a linear conductor disposed on the top surface of the insulating layer 16m. One end of the extended conductor 70 is superposed on the inner peripheral end portion of the coil conductor 50, as viewed from above, while the other end of the extended conductor 70 is connected to the outer terminal 14d. The via-hole conductor v26 passes through the insulating layer 16l in the top-bottom direction, and connects the inner peripheral end portion of the coil conductor 50 and one end of the extended conductor 70 with each other. With this configuration, the signal line L3 is connected between the outer terminals 14a and 14d.

As shown in FIG. 12, the signal line L5 includes a coil conductor 80, extended conductors 91 and 92, and via-hole conductors v30 and v31. The coil conductor 80 is disposed on the top surface of the insulating layer 16h and preferably has a spiral shape in which it advances toward the center while turning around clockwise, as viewed from above.

The extended conductor 91 is a linear conductor disposed on the top surface of the insulating layer 16i. One end of the extended conductor 91 is superposed on the outer peripheral end portion of the coil conductor 80, as viewed from above, while the other end of the extended conductor 91 is connected to the outer terminal 14a. The via-hole conductor v30 passes through the insulating layer 16h in the top-bottom direction, and connects the outer peripheral end portion of the coil conductor 80 and one end of the extended conductor 91 with each other.

The extended conductor 92 is a linear conductor disposed on the top surface of the insulating layer 16i. One end of the extended conductor 92 is superposed on the inner peripheral end portion of the coil conductor 80, as viewed from above, while the other end of the extended conductor 92 is connected to the outer terminal 14d. The via-hole conductor v31 passes through the insulating layer 16h in the top-bottom direction, and connects the inner peripheral end portion of the coil conductor 80 and one end of the extended conductor 92 with each other. With this configuration, the signal line L5 is connected between the outer terminals 14a and 14d.

As shown in FIG. 12, the signal line L6 includes a coil conductor 82, extended conductors 93 and 94, and via-hole conductors v32 and v33. The coil conductor 82 is disposed on the top surface of the insulating layer 16g and preferably has a spiral shape in which it advances toward the center while turning around clockwise, as viewed from above. The coil conductor 82 is superposed on the coil conductor 80, as viewed from above. That is, the coil conductors 80 and 82 oppose each other with the insulating layer 16g interposed therebetween. With this configuration, the coil conductors 80 and 82 are electromagnetically coupled with each other.

The extended conductor 93 is a linear conductor disposed on the top surface of the insulating layer 16f. One end of the extended conductor 93 is superposed on the outer peripheral end portion of the coil conductor 82, as viewed from above, while the other end of the extended conductor 93 is connected to the outer terminal 14d. The via-hole conductor v32 passes through the insulating layer 16f in the top-bottom direction, and connects the outer peripheral end portion of the coil conductor 82 and one end of the extended conductor 93 with each other.

The extended conductor 94 is a linear conductor disposed on the top surface of the insulating layer 16f. One end of the extended conductor 94 is superposed on the inner peripheral end portion of the coil conductor 82, as viewed from above, while the other end of the extended conductor 94 is connected to the outer terminal 14d. The via-hole conductor v33 passes through the insulating layer 16f in the top-bottom direction, and connects the inner peripheral end portion of the coil conductor 82 and one end of the extended conductor 94 with each other. With this configuration, the signal line L6 is connected between the outer terminals 14d.

The capacitor C includes capacitor conductors 40 and 42. The capacitor conductor 40 is disposed on the top surface of the insulating layer 16n and preferably has a rectangular or substantially rectangular shape. The capacitor conductor 40 is connected to the outer terminal 14a.

The capacitor conductor 42 is disposed on the top surface of the insulating layer 16o and preferably has a rectangular or substantially rectangular shape. The capacitor conductor 42 is connected to the outer terminal 14c. The capacitor conductors 40 and 42 oppose each other with the insulating layer 16n interposed therebetween. Accordingly, a capacitance is provided between the capacitor conductors 40 and 42. With this configuration, the capacitor C is connected between the outer terminals 14a and 14c.

In the balun transformer 10e with the structure described above, it is possible to improve balance characteristics, as in the balun transformer 10a.

In the balun transformer 10e, by electromagnetically coupling the signal lines L1 and L4 with each other, the signal lines L2 and L3 with each other, and the signal lines L5 and L6 with each other, impedance transformation is able to be performed. More specifically, in the balun transformer 10e, the characteristic impedance of the output side can be set to be nine times as high as that of the input side.

Fifth Modified Example

Figure 13:
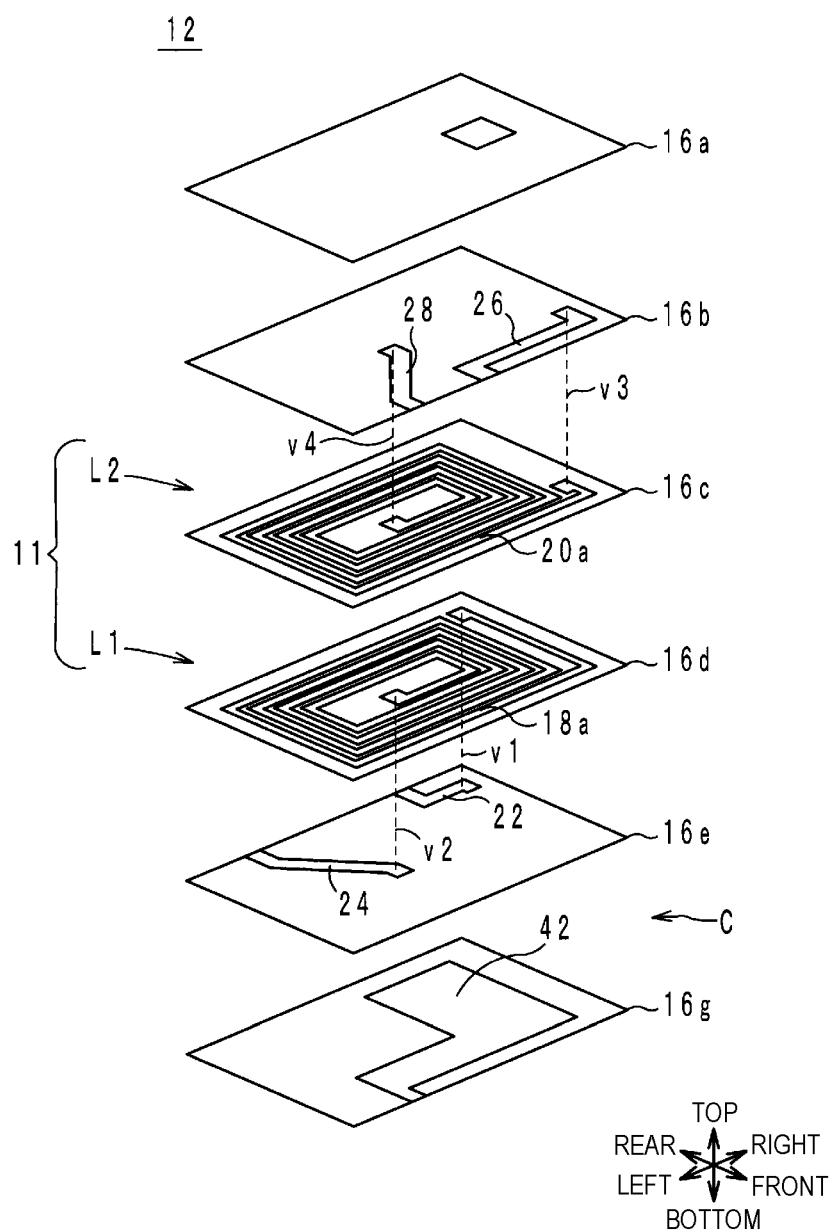
FIG. 13 is an exploded perspective view of a multilayer body of a balun transformer according to a fifth modified example of a preferred embodiment of the present invention.

A balun transformer 10f according to a fifth modified example of a preferred embodiment of the present invention will be described below with reference to the drawings. FIG. 13 is an exploded perspective view of a multilayer body 12 of the balun transformer 10f according to the fifth modified example. The circuit configuration of the balun transformer 10f is the same as that of the balun transformer 10a, and thus, FIG. 1 is used for explaining the balun transformer 10f. The external perspective view of the balun transformer 10f is the same as that of the balun transformer 10a, and thus, FIG. 2 is used for explaining the balun transformer 10f.

The balun transformer 10f is different from the balun transformer 10a in that the capacitor conductor 40 and the insulating layer 16f are not provided. The balun transformer 10f will be discussed below by mainly referring to this point different from the balun transformer 10a.

In the balun transformer 10f, since the capacitor conductor 40 is not provided, the capacitor conductor 42 opposes the coil conductor 18a (that is, the signal line L1) with the insulating layers 16d and 16e interposed therebetween. With this configuration, a capacitance is provided between the capacitor conductor 42 and the coil conductor 18a. That is, the capacitor C is provided by the coil conductor 18a and the capacitor conductor 42.

In the balun transformer 10f with the structure described above, the capacitor conductor 40 and the insulating layer 16f are not provided. Accordingly, it is possible to decrease the height of the balun transformer 10f to be smaller than that of the balun transformer 10a.

In the balun transformer 10b, the capacitor conductor and the insulating layer 16g may be omitted, and the capacitor conductor 42 may be disposed on the top surface of the insulating layer 16f, instead.

In the balun transformer 10c, the capacitor conductor and the insulating layer 16j may be omitted, and the insulating layer 16k on which the capacitor conductor 42 is disposed may be provided between the insulating layers 16e and 16f.

In the balun transformer 10e, the capacitor conductor and the insulating layer 16n may be omitted, and the insulating layer 16o on which the capacitor conductor 42 is disposed may be provided between the insulating layers 16e and 16f.

Sixth Modified Example

Figure 14:
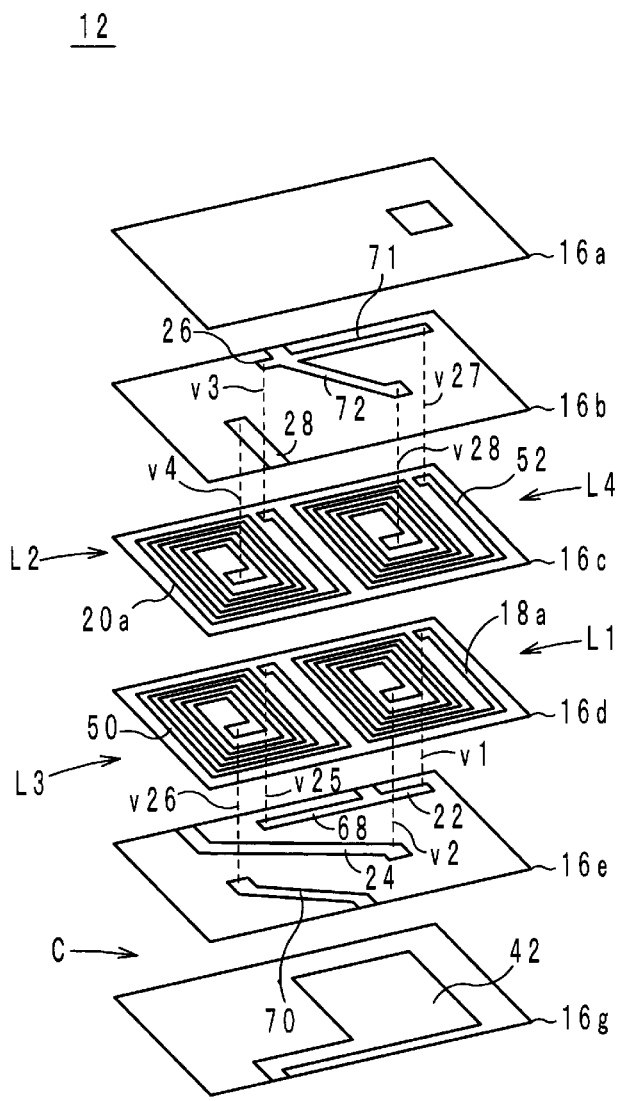
FIG. 14 is an exploded perspective view of a multilayer body of a balun transformer according to a sixth modified example of a preferred embodiment of the present invention.
Figure 14:

A balun transformer 10g according to a sixth modified example of a preferred embodiment of the present invention will be described below with reference to the drawings. FIG. 14 is an exploded perspective view of a multilayer body 12 of the balun transformer 10g according to the sixth modified example. The circuit configuration of the balun transformer 10g is the same as that of the balun transformer 10c, and thus, FIG. 8 is used for explaining the balun transformer 10g. The external perspective view of the balun transformer 10g is the same as that of the balun transformer 10a, and thus, FIG. 2 is used for explaining the balun transformer 10g.

The balun transformer 10g is different from the balun transformer 10d in that the capacitor conductor 40 and the insulating layer 16f are not provided and in that the capacitor conductor 42 opposes the coil conductor 18a but does not oppose the coil conductor 50. The balun transformer 10g will be discussed below by mainly referring to these points different from the balun transformer 10d.

In the balun transformer 10g, since the capacitor conductor 40 is not provided, the capacitor conductor 42 opposes the coil conductor 18a (that is, the signal line L1) with the insulating layers 16d and 16e interposed therebetween. However, since the capacitor conductor 42 is disposed mainly on the right half region of the insulating layer 16g, it opposes the coil conductor 50 only negligibly. With this configuration, a capacitance is provided between the capacitor conductor 42 and the coil conductor 18a. That is, the capacitor C is provided by the coil conductor 18a and the capacitor conductor 42.

In the balun transformer 10g with the structure described above, the capacitor conductor 40 and the insulating layer 16f are not provided. Accordingly, it is possible to decrease the height of the balun transformer 10g to be smaller than that of the balun transformer 10d.

Other Preferred Embodiments

Balun transformers according to the present invention are not restricted to the above-described balun transformers 10a through 10g, and modifications may be made within the spirit of the present invention.

The signal lines L1 through L6 preferably include coil conductors, but they may include linear conductors.

The balun transformers 10a through 10g each preferably include one electronic component, but they may each include a plurality of electronic components or a combination of an electronic component and a circuit substrate.

As described above, preferred embodiments of the present invention are suitably used as balun transformers, and particularly, are excellent in terms of improved balance characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A balun transformer comprising:
    an input terminal into which an unbalanced signal is input;
    a converter that includes at least a first signal line connected to the input terminal and that converts the unbalanced signal into a balanced signal;
    a first output terminal connected to the first signal line;
    a second output terminal from which the balanced signal is output, the balanced signal being also output from the first output terminal; and
    a capacitor connected between the input terminal and the second output terminal; wherein
    the converter further includes a second signal line which is connected to the second output terminal and which is electromagnetically coupled with the first signal line.

2. The balun transformer according to claim 1, further comprising:
    a multilayer body including a plurality of insulating layers stacked on each other; wherein
    the first signal line, the second signal line, and the capacitor include conductors disposed on some of the plurality of insulating layers.

3. The balun transformer according to claim 2, wherein the plurality of insulating layers are made of a dielectric material.

4. The balun transformer according to claim 1, further comprising:
    a multilayer body including a plurality of insulating layers stacked on each other; wherein
    the first signal line and the capacitor include conductors disposed on some of the plurality of insulating layers; and
    the capacitor opposes the first signal line with some of the plurality of insulating layers interposed therebetween, and includes the first signal line and a capacitor conductor electrically connected to the second output terminal.

5. The balun transformer according to claim 1, wherein the first signal line includes a coil conductor that produces a 90° phase lag for a voltage of a signal passing through the coil conductor.

6. The balun transformer according to claim 1, wherein a 180° phase difference exists between a voltage of a signal output from the first signal line and that from the second signal line.

7. The balun transformer according to claim 1, wherein an input signal input into the capacitor passes through the capacitor and joins a signal output from the second signal line.

8. The balun transformer according to claim 1, wherein the capacitor produces a 90° phase lead for a voltage of a signal passing through the capacitor.

9. The balun transformer according to claim 1, wherein the first and second signal lines include coil conductors or linear conductors.

10. A balun transformer comprising:
    an input terminal into which an unbalanced signal is input;

a converter that includes at least a first signal line connected to the input terminal and that converts the unbalanced signal into a balanced signal;

a first output terminal connected to the first signal line;

a second output terminal from which the balanced signal is output, the balanced signal being also output from the first output terminal; and a capacitor connected between the input terminal and the second output terminal; wherein the converter further includes a second signal line connected to the second output terminal, a third signal line connected to the second signal line and electromagnetically coupled with the first signal line, and a fourth signal line connected to the input terminal and electromagnetically coupled with the second signal line.

11. The balun transformer according to claim 10, wherein the converter further includes a fifth signal line connected to the input terminal and a sixth signal line electrically connected to the second signal line and electromagnetically coupled with the fifth signal line.

12. The balun transformer according to claim 11, further comprising:

a multilayer body including a plurality of insulating layers stacked on each other; wherein the first signal line, the second signal line, the third signal line, the fourth signal line, and the capacitor include conductors disposed on some of the plurality of insulating layers.

13. The balun transformer according to claim 12, wherein the first signal line and the fourth signal line oppose each other with an insulating layer of the plurality of insulating layers interposed therebetween so as to be electromagnetically coupled with each other; and the second signal line and the third signal line oppose each other with an insulating layer of the plurality of insulating layers interposed therebetween so as to be electromagnetically coupled with each other.

14. The balun transformer according to claim 12, wherein the capacitor includes a first capacitor conductor and a second capacitor conductor;

the first signal line and the fourth signal line oppose each other with an insulating layer of the plurality of insulating layers interposed therebetween so as to be electromagnetically coupled with each other;

the second signal line and the third signal line oppose each other with an insulating layer of the plurality of insulating layers interposed therebetween so as to be electromagnetically coupled with each other;

the first signal line and the third signal line are disposed on an identical insulating layer; and the second signal line and the fourth signal line are disposed on an identical insulating layer.

15. The balun transformer according to claim 12, wherein the plurality of insulating layers are made of a dielectric material.

16. The balun transformer according to claim 13, wherein the plurality of insulating layers are made of a dielectric material.

17. The balun transformer according to claim 14, wherein the plurality of insulating layers are made of a dielectric material.

* * * * *